June 16, 1964 J. A. DEVELET, JR 3,137,819

CONTROLLED BLOCKING OSCILLATOR HAVING EQUAL "ON" AND "OFF" PERIODS

Filed Aug. 21, 1959

JEAN A. DEVELET, JR
INVENTOR.
BY George C. Thompson Jr. agent
Morris Spector,
ATTORNEY

United States Patent Office 3,137,819
Patented June 16, 1964

3,137,819

CONTROLLED BLOCKING OSCILLATOR HAVING EQUAL "ON" AND "OFF" PERIODS

Jean A. Develet, Jr., Hermosa Beach, Calif., assignor, by mesne assignments, to The Bunker-Ramo Corporation, Canoga Park, Calif., a corporation of Maryland
Filed Aug. 21, 1959, Ser. No. 835,300
5 Claims. (Cl. 328—63)

This invention relates to a controlled blocking oscillator and more particularly to a controlled blocking oscillator having equal "on" and "off" periods while utilizing relatively low power input control pulses.

Blocking oscillators have, in some instances, been controlled to be active through an input pulse with the length of each oscillation "on" period being limited by transformer primary inductance and the length of each "off" period being limited by the resistance and capacitance of the oscillator control grid circuit. The successive "on" and "off" periods of the oscillator are continued by the input control pulse by holding the bias on the oscillator control grid sufficiently positive to provide a new conduction pulse following each off period. The length of each "off" period is controlled by the time necessary to discharge a grid capacitor. If equal "on" and "off" periods are needed, a very low value bleed resistor would be necessary resulting at least in changes in the "on" and "off" periods when small temperature resistance changes occur even asuming the equal periods could be obtained by this method. In addition high power control pulses would be required for initiating operation.

It is, therefore, an object of this invention to provide a new and improved blocking oscillator capable of equal "on" and "off" oscillation periods.

It is another object of this invention to provide a blocking power oscillator capable of utilizing a low power gating pulse while maintaining equal "on" and "off" oscillation periods.

It is another object of this invention to provide a power blocking oscillator in which no loss time period is needed to discharge the oscillator grid control capacitor.

It is still another object of this invention to provide a blocking oscillator in which small changes in the grid control bias circuit components provide small effect in the blocking oscillator operation period.

Other objects, purposes and characteristic features will become obvious as the description of the invention progresses.

In practicing this invention there is in one embodiment an arrangement of zener type reverse breakdown diodes for controlling the charging level of a blocking oscillator tube grid control capacitor to an extent capable of allowing relatively short "off" periods in view of the fact that a discharge time period for the control capacitor is not needed. The zener diode capacitor arrangement allows the use of relatively high resistances in the control grid circuit without causing an extension of the "off" period needed by the oscillator. The length of the "off" period is then relatively independent of the resistance appearing in the grid circuit.

Figure 1:
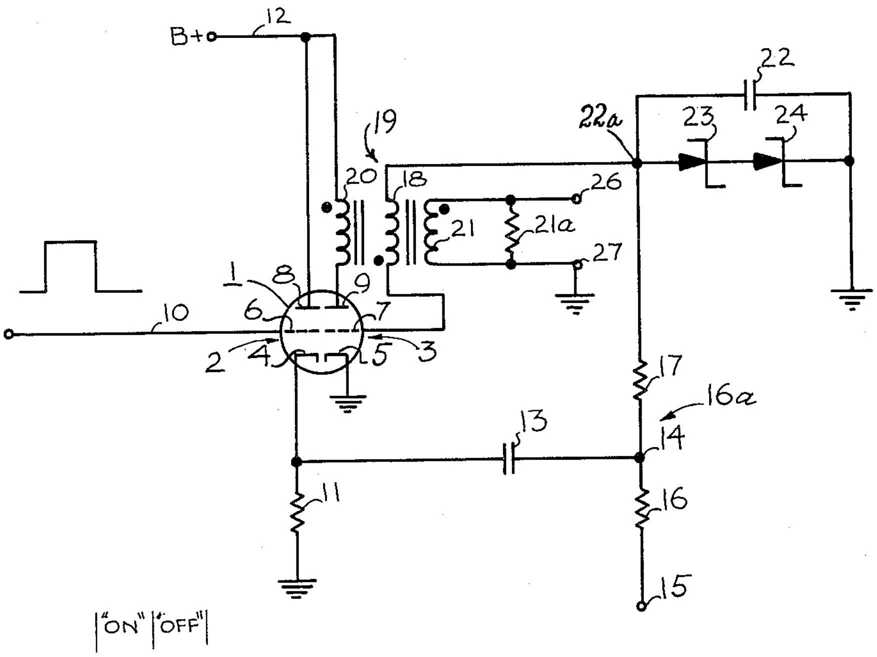
FIGURE 1 is a schematic view of one typical embodiment of the oscillator of this invention.

The blocking oscillator of FIGURE 1 comprises an oscillator tube 1 of any one of the dual purpose type including two triode sections, 2 and 3, provided with cathodes 4 and 5, respectively, grids 6 and 7, respectively, and anodes 8 and 9, respectively. The triode section 2 has its grid 6 connected to a suitable gating pulse source (not shown) through a conductor 10. The cathode 4 is connected by a cathode bias resistor 11 to a common ground. The anode 8 of the triode section 2 is connected to a suitable B supply conductor 12 to provide anode potential to the anode 8. The source conductor 12 is connected to a B supply source (not shown), which has one terminal also connected to ground completing the anode-cathode circuit for the triode section 2.

With zero potential input to the conductor 10 and grid 6, the triode section 2 is biased to cutoff and thus is non-conductive. The appearance of a positive pulse on the conductor 10 provides sufficient positive bias to the triode section 2 to cause conduction and, therefore, current flow through the anode 8, cathode 4 circuit of the triode section 2. The flow of current through the cathode resistor 11 causes a change of potential of the cathode 4 which is sensed by the coupling capacitor 13 to provide a change in potential at the point 14 in the grid circuit of the triode section 3. During non-conducting periods of the triode section 3 the point 14 is maintained at a potential below cutoff for the triode section 3 by a suitable negative bias source (not shown) connected to the terminal 15 and to the terminal 14 through a resistor 16 of a voltage divider 16*a*. The point 14 is then connected to the grid 7 of the triode section 3 through a second resistor 17, of the voltage divider 16*a*, and an oscillator grid control winding 18 of the oscillator transformer 19.

In addition to the grid control winding 18, the oscillator transformer is provided with an anode winding 20 connected between the B supply source conductor 12 and the anode 9 and an output winding 21 mutually coupled to the windings 18 and 20. The ouptut winding 21 is provided with a ballast resistor 21*a*, which may be all or a portion of the oscillator load, connected thereacross and a pair of output terminals 26 and 27.

During non-conduction of the triode section 3 full B supply voltage appears on the anode 9 to condition the tube triode section 3 for conduction when the bias of the grid 7 is proper. It should be understood that the cathode 5 of the triode section 3 is also connected to the common ground. It should be clear, therefore, that during nonconduction periods the full B supply potential appears between the cathode 5 and anode 9.

In order to sustain oscillation during "on" periods of the triode section 3, it is necessary to provide the grid 7 with a control circuit having an oscillator voltage control capacitor 22 capable of providing a path between the grid 7 and the cathode 5 for the oscillating voltage. The capacitor 22 is connected between a point 22*a* between the grid control winding 18 and the voltage divider resistor 17 and ground.

In well-known blocking oscillators, however, it is also necessary to provide a capacitor leak resistor for discharging the capacitor during oscillator "off" periods before the grid 7 can be driven sufficiently positive to again allow an "on" period to occur. In place of this capacitor leak resistor, the present oscillator circuit provides a limiting circuit comprising a pair of zener diodes 23 and 24 for maintaining a desired voltage level on the capacitor 22.

With the voltage level of the capacitor 22 limited to a relatively low value the input gating pulse from the triode section 2 will have to be only 20 percent of the B supply voltage. For example in one embodiment a pulse voltage of 30 volts in the section 2 was used with a B supply of 175 volts and with a high resistance input to triode section 3 very low power in the 30 volt pulse was needed.

Operation of the second half of the oscillator tube 1 will now be described. During the period prior to any input voltage to the point 14 from the cathode 4 of the triode section 2 the triode section 3 is nonconductive and a portion of the negative bias voltage appearing at the terminal point 15 appears at the grid 7. The potential appearing at the grid 7 is sufficient to block conduction of the triode section 3.

An appearance of a voltage at the point 14, supplied by the cathode 4 of the triode section 2 in response to a pulse gate on the conductor 10 causes the point 14 to raise in potential sufficiently to allow the grid 7 to cease blocking the triode section 3. This potential rise at the point 14 is allowed by the voltage divider resistors 16 and 17 which are selected to allow the point 14 to become zero or near zero in potential in response to an input pulse from the triode section 2. The grid 7 is now of a potential capable of losing control of the tube with the result of conduction occurring between the cathode 5 and anode 9. The flow of current through the triode section 3 also causes grid current to flow and since this current flow through the triode section 3 is relatively heavy and the voltage across the transformer windings high, flux density within the transformer 19 core begins to increase. The grid current flow results in a charge building up on the capacitor 22 to the level of the reverse breakdown voltage presented by the zener diodes 23 and 24. At this point the diodes breakdown in reverse direction causing the capacitor 22 to continuously maintain this potential.

Conduction of the triode section 3 continues until it can no longer provide the increased current demanded by transformer 19. During this period an output occurs at the terminals 26 and 27 in response to the transformer winding 21. When the current in triode section 3 can no longer increase to charge the primary inductance of transformer 19 the pulse ceases and triode section 3 returns to a nonconducting state and the saturation level of the transformer rapidly becomes reduced due to the losses within the transformer and hysteresis loop action. In view of the fact that the capacitor 22 has been limited in its charge level by the zener diodes 23 and 24 it is not necessary to provide a time period for the bleed off of the charge on the capacitor 22. The potential level of this capacitor is already sufficiently low to allow an immediate following "on" period. So long as the gate pulse appearing on the conductor 10 allows conduction in the triode section 2 continuous "on" and "off" periods of the triode section 3 controlled only by the primary inductance of the transformer 19 will occur. The number of repeating oscillator cycles of the triode section 3 is limited only by the length of the gate pulse appearing on the conductor 10.

At the end of the gate pulse on the conductor 10 the grid 6 of the triode section 2 is returned to cutoff for the triode section 2 thus causing the point 14 in the grid circuit of the triode section 3 to again approach the bias potential at the terminal 15 to cause cessation of triode section 3 conduction.

Figure 2:
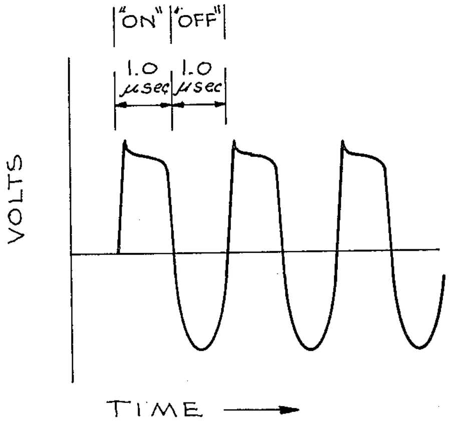
FIGURE 2 is a typical oscillator waveform showing the substantially equal "on" and "off" periods of the oscillator.

In the view of FIGURE 2 a typical curve showing "on" and "off" periods of equal length is presented. The relationship of "on" and "off" periods can be adjusted by the size of the capacitor 22 and the number or type of zener diodes used in parallel therewith. The diodes may number one or more as desired for the particular operation.

In some cases it may be desirable to eliminate the capacitor 22 entirely since operation with zener type diodes only can take place.

While there have been described what are at present considered the preferred embodiments of the invention, it will be obvious to those skilled in the art that various changes and modifications may be made therein without departing from the invention.

I claim:

1. A blocking oscillator comprising: an electron tube having an anode, cathode and a control grid; a transformer having a plurality of windings; a first of said plurality of windings being connected to receive anode current; a second of said windings being connected to receive control grid current; cutoff bias source means connected to supply cutoff bias to said control grid; input means connected to said control grid to selectively modify the effective control grid voltage for initiating conduction of said tube; oscillator circuit means including said second winding for providing oscillator grid current flow between said grid and said cathode; and voltage control means connected between said cathode and said second winding at a point remote from said grid, said voltage control means responsive to a certain threshold potential in said circuit means for limiting the potential to a level not affecting subsequent initial tube conduction; said voltage control means comprising at least one "constant voltage impedance means."

2. A blocking oscillator comprising: an electron tube having an anode, cathode and a control grid; a transformer having a plurality of windings; a first of said plurality of windings being connected to receive anode current; a second of said windings being connected to receive control grid current; cutoff bias source means connected to supply cutoff bias to said control grid; input means connected to said control grid to selectively modify the effective control grid voltage for initiating conduction of said tube; oscillator circuit means including said second winding for providing oscillator grid current flow between said grid and said cathode; and voltage control means connected between said cathode and said second winding at a point remote from said grid for limiting the potential in said circuit means to a level not affecting subsequent initial tube conduction; said voltage control means comprising a capacitor shunted by zener diode means.

3. A blocking oscillator comprising: an electron tube having an anode, cathode and a control grid; a transformer having a plurality of windings; a first of said plurality of windings being connected to receive anode current; a second of said windings being connected to receive control grid current; cutoff bias source means connected to supply cutoff bias to said control grid; input means connected to said control grid to selectively modify the effective control grid voltage for initiating conduction of said tube; oscillator circuit means including said second winding for providing oscillator grid current flow between said grid and said cathode; and voltage control means connected between said cathode and said second winding at a point remote from said grid for limiting the potential in said circuit means to a level not affecting subsequent initial tube conduction; said voltage control means including a capacitor shunted by zener diode means; said capacitor being maintained at a maximum voltage level which is less than the control grid bias level needed to maintain cutoff of the tube during input means selective operation.

4. A blocking oscillator comprising: an electron tube having an anode, a cathode and a control grid; a transformer having a plurality of windings; a first of said plurality of windings being connected to receive anode current; a second of said plurality of windings being connected to receive control grid current; input means including a capacitor for controlling conduction of said tube; said capacitor having one side connected through said second winding to said control grid and another side connected to said cathode; and voltage control means including "constant voltage impedance means" connected across said capacitor and responsive to the development of a threshold potential on said capacitor for preventing said capacitor from charging beyond said threshold value above which subsequent conduction of said tube is affected.

5. The blocking oscillator defined by claim 4, wherein said "constant voltage impedance means" comprises at least one zener diode.

References Cited in the file of this patent

UNITED STATES PATENTS

| | | |
|---|---|---|
| 2,257,663 | Albrecht | Sept. 30, 1941 |
| 2,449,923 | Anderson | Sept. 21, 1948 |
| 2,886,706 | Rogers | May 12, 1959 |
| 2,894,212 | Knauss | July 7, 1959 |
| 2,922,037 | Reise | Jan. 19, 1960 |
| 2,972,118 | Ville | Feb. 14, 1961 |